(12) United States Patent
    Aliane

(10) Patent No.: US 9,111,924 B2
(45) Date of Patent: Aug. 18, 2015

(54) FLIP-CHIP HYBRIDIZATION OF MICROELECTRONIC COMPONENTS BY LOCAL HEATING OF CONNECTING ELEMENTS

(71) Applicant: Commissariat A L'Energie Atomique Et Aux Energies Alternatives, Paris (FR)

(72) Inventor: Abdelkader Aliane, Grenoble (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 14/225,963

(22) Filed: Mar. 26, 2014

(65) Prior Publication Data

US 2014/0210076 A1    Jul. 31, 2014

Related U.S. Application Data

(63) Continuation of application No. PCT/FR2012/052416, filed on Oct. 23, 2012.

(30) Foreign Application Priority Data

Oct. 25, 2011    (FR) ..................... 11 59639

(51) Int. Cl.
    *H01L 21/44*    (2006.01)
    *H01L 23/528*   (2006.01)
    (Continued)

(52) U.S. Cl.
    CPC .... *H01L 23/49811* (2013.01); *H01L 21/76885* (2013.01); *H01L 23/345* (2013.01);
    (Continued)

(58) Field of Classification Search
    CPC ................ H01L 21/76885; H01L 23/49811; H01L 24/11
    USPC ........................... 257/737; 438/615
    See application file for complete search history.

(56) References Cited

U.S. PATENT DOCUMENTS 5,010,233 A    4/1991   Henschen et al.
5,951,893 A *  9/1999   Bitko et al. ............ 219/209
                        (Continued)

FOREIGN PATENT DOCUMENTS

EP    2 175 485 A2    4/2010
JP    11-307918 A1    11/1999

OTHER PUBLICATIONS

International Search Report dated Apr. 9, 2013.

*Primary Examiner* — Christine Enad
(74) *Attorney, Agent, or Firm* — Burr & Brown, PLLC (57) ABSTRACT

A method of forming a hybridized device including forming a first component provided with metal bumps, and a second component provided with connection elements, attaching the bumps to the connection elements. The manufacturing of the second component includes forming, on a surface of a substrate, resistive elements at the locations provided for the connection elements; depositing an electric insulator layer at least on the resistive elements; and forming the connection elements, each comprising a metal well having an opening capable of receiving the corresponding metal bump of the first microelectronic component and at least partially filled with a fusible element, particularly indium or an alloy of tin and gold, or with a conductive ink, particularly based on silver or copper. Further, the attachment of the balls to the connection elements comprises applying an electric current through the resistive elements to heat the bumps.

12 Claims, 5 Drawing Sheets

(51) Int. Cl.
  *H01L 23/498* (2006.01)
  *H01L 23/34* (2006.01)
  *H01L 23/00* (2006.01)
  *H01L 21/768* (2006.01)

(52) U.S. Cl.
  CPC .... *H01L23/49816* (2013.01); *H01L 23/49894* (2013.01); *H01L 24/11* (2013.01); *H01L 24/13* (2013.01); *H01L 24/16* (2013.01); *H01L 24/81* (2013.01); *H01L 24/98* (2013.01); *H01L 2224/10175* (2013.01); *H01L 2224/1183* (2013.01); *H01L 2224/11552* (2013.01); *H01L 2224/13011* (2013.01); *H01L 2224/13075* (2013.01); *H01L 2224/13109* (2013.01); *H01L 2224/13111* (2013.01); *H01L 2224/13144* (2013.01); *H01L 2224/13155* (2013.01); *H01L 2224/13166* (2013.01); *H01L 2224/13184* (2013.01); *H01L 2224/8114* (2013.01); *H01L 2224/81141* (2013.01); *H01L 2224/81191* (2013.01); *H01L 2224/81193* (2013.01); *H01L 2224/81234* (2013.01); *H01L 2224/81238* (2013.01); *H01L 2224/81385* (2013.01); *H01L 2224/81409* (2013.01); *H01L 2224/81411* (2013.01); *H01L 2224/81439* (2013.01); *H01L 2224/81447* (2013.01); *H01L 2224/81815* (2013.01); *H01L 2924/01029* (2013.01)

(56) References Cited

U.S. PATENT DOCUMENTS

| | | | | |
|---|---|---|---|---|
| 6,306,688 | B1 * | 10/2001 | Lunceford | 438/127 |
| 6,423,939 | B1 * | 7/2002 | Pan | 219/209 |
| 7,810,701 | B2 | 10/2010 | Nagano et al. | |
| 2002/0076535 | A1 | 6/2002 | Cooray | |
| 2002/0094707 | A1 | 7/2002 | Hedler | |
| 2004/0101993 | A1 | 5/2004 | Salmon | |
| 2008/0187772 | A1 | 8/2008 | Glever et al. | |
| 2011/0035925 | A1 | 2/2011 | Marion | |
| 2011/0300664 | A1 * | 12/2011 | Chung | 438/80 |
| 2012/0139090 | A1 * | 6/2012 | Kim et al. | 257/659 |

* cited by examiner

FLIP-CHIP HYBRIDIZATION OF MICROELECTRONIC COMPONENTS BY LOCAL HEATING OF CONNECTING ELEMENTS

FIELD OF THE INVENTION

The invention relates to the assembly of microelectronic components, and more particularly to "flip-chip" hybridization.

BACKGROUND

An assembly by the so-called "flip-chip" technique usually comprises forming electrically-conductive bumps on a surface of a first electronic component and forming electrically-conductive connection elements, particularly bumps or connection areas, on a surface of a second component according to a predetermined connection pattern. The first component is then transferred onto the second component to place the bumps in correspondence with the connection elements, after which the assembly is pressed and heated. The bumps then deform and melt to form electric connections perpendicular to the main plane of the electronic component, generally in the form of a wafer.

The most conventional technique to form the assembly is to perform a general heating of the assembly, for example, by placing the two components under a temperature-controlled atmosphere.

However, the melting of a metal bump requires high temperatures, typically higher than 156° C. Now, such temperatures are not compatible with organic components, particularly plastic components such as PEN (polyethylene naphthalate) and PET (polyethylene terephthalate), which have glass transition temperatures lower than these temperatures, respectively of 120° C. for PEN and 70° C. for PET, for example. Thus, when submitting a plastic component to the solder bump melting temperature, the plastic component takes a rubbery state and strongly deforms, or is even destroyed.

Methods implementing a local heating of the metal bumps are also known. For example, U.S. Pat. No. 7,810,701 describes a component comprising contacts in the form of resilient spirals covered with a resistive layer having the bumps deposited thereon. By circulating a high-frequency electric current in the spirals, an electromagnetic field which causes the melting of the resistive layer and of the bumps is created. This method is thus irreversible and does not enable to separate the two hybridized components without causing their destruction.

SUMMARY OF THE INVENTION

The present invention aims at providing a method and a device enabling to achieve a hybridization which is reversible while being mechanically resistant, and which implement a local heating of metal bumps.

For this purpose, the invention aims at a method of manufacturing a hybridized device, comprising:

forming a first microelectronic component provided on a surface with metal bumps, and a second microelectronic component provided on a surface with connection elements corresponding to said metal bumps;

placing the bumps of the first microelectronic component into contact with the connection elements of the second microelectronic component; and attaching the bumps to the connection elements.

According to the invention:

the forming of the second microelectronic component comprises:

forming a substrate;

forming, on a surface of the substrate, resistive elements at the locations provided for the connection elements;

depositing an electric insulator layer at least on the resistive elements; and forming the connection elements, each comprising a metal well having an opening capable of receiving the corresponding metal bump of the first micro-electronic component and at least partially filled with a fusible element, particularly indium or an alloy of tin and gold, or with a conductive ink, particularly based on silver or copper, and the attachment of the bumps to the connection elements comprises applying an electric current through the resistive elements to heat the bumps.

In other words, the connection elements and the bumps are locally heated by convection through an electrically-insulating layer, without the heating elements being themselves destroyed. Not only is the heating performed locally, which limits as much as possible the heating of the second microelectronic component, but it is further possible to dehybridize the two microelectronic components by having current circulate again in the heating elements, thus allowing their separation.

Further, the wells particularly enable to mechanically strengthen the hybridized assembly. The ink, annealed on heating, or the fusible material partially filling the wells enables to define a wettable surface for the bumps and to form an electric connection therewith, while also mechanically strengthening the interconnect between the two hybridized circuits.

More particularly, the manufacturing of the metal well comprises forming a metal area and cutting with a laser an opening in said metal area. The laser etching, for example, by means of an excimer laser, has the advantage of providing a very local heating, and thus of limiting unwanted thermal effects on the second microelectronic component, while allowing a high photonic energy input. The size of the well opening is for example adjusted by means of the difference in thermal expansion coefficients between the material of the metal area and the material of the substrate.

According to an embodiment, the electric insulator is a fluorinated polymer of low dielectric constant, particularly a dielectric constant equal or close to 2. Fluorinated polymers have a very high chemical stability, a very high melting temperature, as well as a very good thermal conductivity. Further, the insulator is advantageously obtained by applying an anneal of steep slope to an emulsion of this polymer in one or several solvents, which enables to very rapidly evaporate the solvent(s) contained in said emulsion, which generates micropores filled with air in the finally-obtained insulator.

According to an embodiment, the resistive elements are made in the form of coils or rods. Particularly, the resistive elements are series-connected. The resistive elements thus have a strong electric resistance. It is thus possible to obtain a strong heating with a low current and/or within a very short time.

According to an embodiment, on application of the current, the surface of the second microelectronic component, opposite to the surface provided with the connection elements, is cooled down, which enables to decrease the impact of the heating, even local, on the second microelectronic component.

According to an embodiment, the substrate of the second microelectronic component comprises plastic, particularly PEN or PET. For example, the substrate is a flexible substrate.

The invention also aims at a hybridized device comprising:
a first microelectronic component provided on one surface with metal bumps; and
a second microelectronic component provided on one surface with connection elements corresponding to said metal bumps, the metal bumps and the connection elements being mechanically attached.

According to the invention, the second microelectronic component comprises:
a substrate;
resistive elements at the longitudinal station of the connection elements;
an electric insulator layer interposed between the resistive elements and the connection elements; and
electric terminals for the application of an electric current in the resistive elements.

Further, the connection elements of the device each comprise a metal well receiving the corresponding metal bump of the first microelectronic component, at least partially filled with a fusible element, particularly indium or an alloy of tin and gold, or of a conductive ink, particularly based on silver or copper.

The invention also aims at a device intended to be hybridized to another device provided with metal bumps, comprising:
a substrate;
connection elements, arranged on a surface of the substrate and capable of being rigidly attached to said metal bumps, said elements each comprising a metal well having an opening capable of receiving the corresponding metal bump of the first microelectronic component and at least partially filled with a fusible element, particularly indium or an alloy of tin and gold, or with a conductive ink, particularly based on silver or copper;
resistive elements at the longitudinal station of the connection elements;
an electric insulator layer interposed between the resistive elements and the connection elements; and
electric terminals for the application of an electric current in the resistive elements.

BRIEF DESCRIPTION OF THE DRAWINGS

The invention will be better understood on reading of the following description provided as an example only in relation with the accompanying drawings, where the same reference numerals designate the same or similar elements, among which.

DETAILED DESCRIPTION

Figure 1:
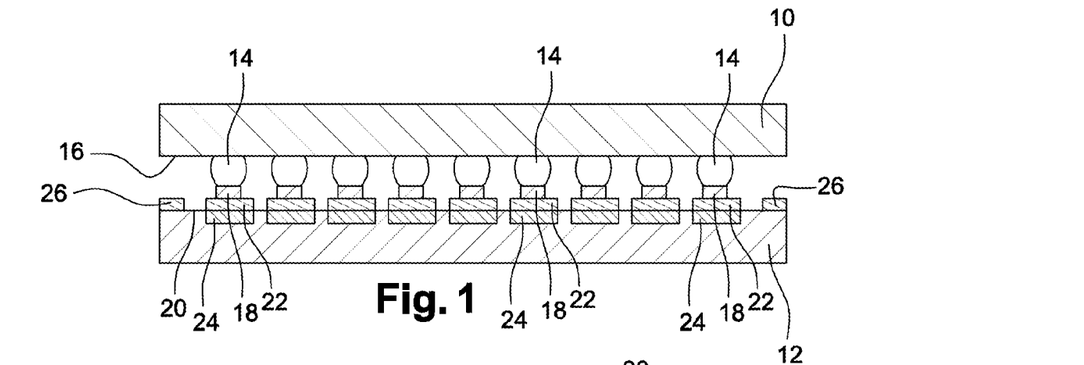
FIG. 1 is a simplified cross-section view of an device according to the invention comprising two hybridized microelectronic components.

In FIG. 1, a device according to the invention comprises a first microelectronic component 10, for example, a microelectronic chip based on silicon hybridized to a second microelectronic component 12.

The two components 10 and 12 are hybridized by means of metal bumps 14 arranged on wettable areas of a surface 16 of first component 10, and mechanically attached to corresponding connection elements 18 arranged on a surface 20 of second component 12, as will be described in further detail hereafter.

Each connection element 18 is further formed on a layer made of an electrically-insulating material 22, particularly a dielectric layer, deposited on a resistive element 24 formed on top and/or inside of second component 12. Finally, metal terminals 26 are provided on top and/or inside of second component 12 for the application of an electric current in resistive elements 24.

A method for manufacturing the device just described according to a first embodiment of the invention will now be described in further detail in relation with FIGS. 2 to 12.

Figure 2:
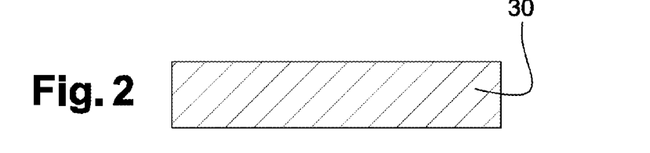
FIGS. 2 to 12 are simplified views illustrating a manufacturing method according to a first embodiment of the invention.

The method starts with the manufacturing of a substrate 30 of second component 12 (cross-section view of FIG. 2). Substrate 30 is for example a flexible plastic substrate particularly made of PET or of PEN, a silicon substrate comprising microelectronic circuits, or the like.

Figure 3:
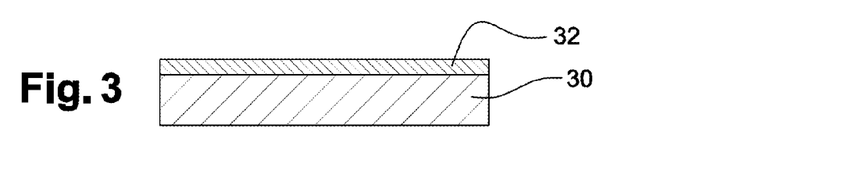
Figure 4:
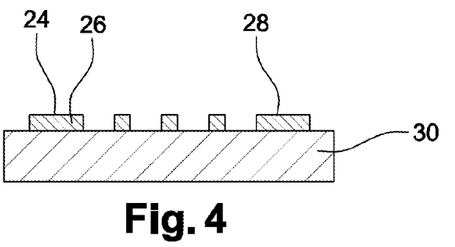
Figure 5:
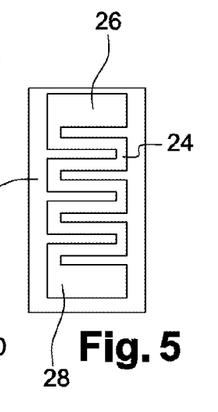
Figure 6:
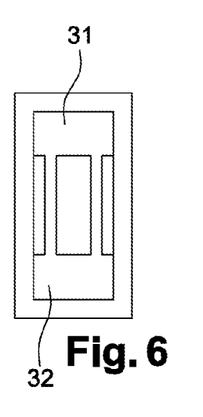

A metal layer 32 is then deposited full plate on a surface of substrate 30, for example, by evaporation or sputtering (cross-section view of FIG. 3). Layer 32 is for example a gold, titanium, nickel, copper, or tungsten layer and has a thickness in the range from 30 nanometers to 300 nanometers, to keep the flexibility of substrate 30 by limiting the effects of the difference between the thermal expansion coefficient of substrate 30 and that of metal layer 32.

Layer 32 is then etched to form resistive elements 24. The shape of elements 24 is selected according to the local heating desired on hybridization of components 10, 12.

Preferably, elements 24 are threadlike and have a great curvilinear length for a small width and/or a small height, which enables to define a high electric resistance, and accordingly a strong Joule effect heating. Resistive elements 24 are for example formed of coils each arranged between two areas 26, 28 (top view of FIG. 5) or a set of strips or rods, for example, two strips, connected in parallel between two areas 30, 32 (top view of FIG. 6). The material and the thickness of layer 32, and thus of resistive elements 24, are also selected according to the local heating desired on hybridization of components 10, 12, as will be explained in further detail hereafter.

Elements 24 may also be formed by locally depositing layer 32 and by etching it, or directly by means of a photolithography and an etching.

The method carries on with the deposition of an electric insulator layer 34, for example, a dielectric layer, at least on resistive elements 24 (cross-section view of FIG. 7) to avoid any short-circuit between them and subsequently-manufactured connection elements 18, and thus also to avoid any short circuit between resistive elements 24 and metal bumps 14 of first component 10. Layer 34 is for example deposited full plate over the entire substrate 30, or only on resistive elements 24.

Figure 7:
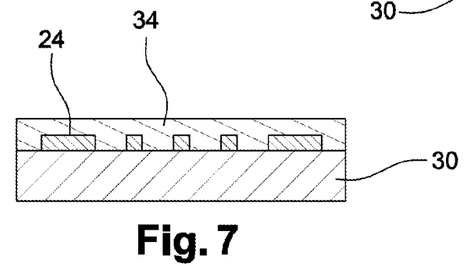

Preferably, layer 34 is made of a material which is also a good heat conductor and which has a higher melting temperature than metal bumps 14, to avoid the melting of layer 34 on hybridization. Advantageously, layer 34 is thus made of a fluorinated polymer of low dielectric constant which has a high chemical stability as well as a good heat conductivity if annealed very rapidly. Layer 34 is for example deposited by silk-screening or by inkjet.

Figure 8:
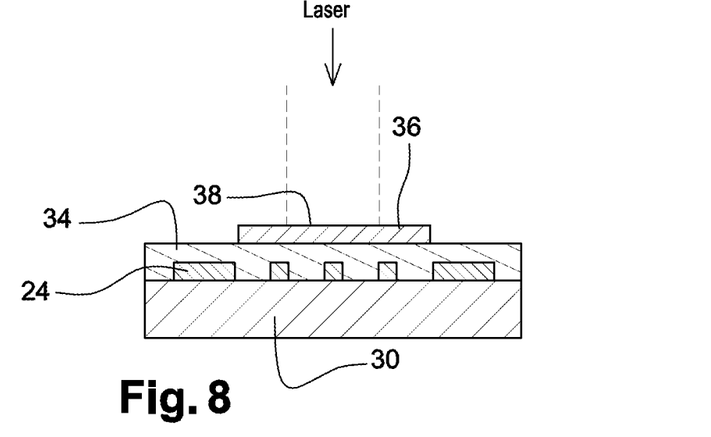

A metal area 36, also called "UBM" area (Under Bump Metallization>>), is then deposited on insulating layer 34 at the longitudinal station of each resistive element 24, this layer being typically made of gold, titanium, nickel, copper, or tungsten, and for example made of the same metal as resistive elements 24 (cross-section view of FIG. 8).

A central area 38 of each area 36 is then submitted to a local heating, advantageously by means of a laser, for example, of excimer type, which enables to limit thermal effects on substrate 30 while providing a significant photon energy.

Metal area 36 and insulating layer 34 expand under the effect of the local heat. Since the materials forming them are different, area 36 and layer 34 thus have different thermal expansion coefficients, with the metal of area 36 having, in particular, a coefficient greater than that of layer 34.

Figure 9:
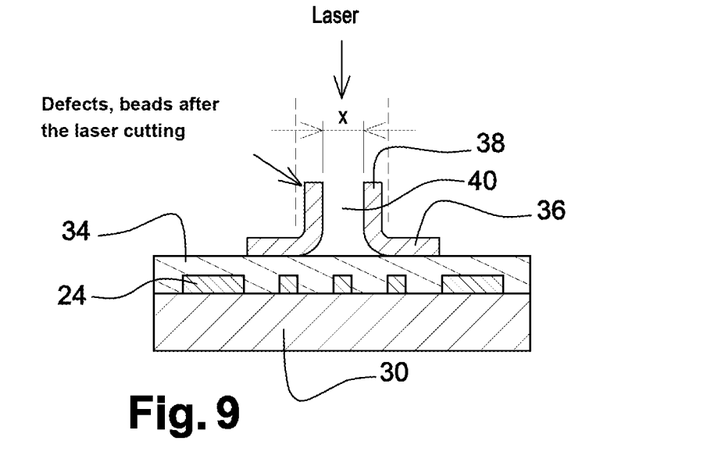

The heating thus results in an expansion difference which causes the separation of central area 36 and the forming of one or several beads defining a well 40 (cross-section view of FIG. 9). Width x of well 40 is especially determined by the difference in thermal expansion coefficient between area 36 and layer 34 and is selected to be greater than the diameter of bump 14 which will be subsequently introduced into well 40. This especially enables to adjust the dimension of well 40 according to the temperature of heating element 24 during a hybridization, but also a dehybridization. Particularly, the local heating increases expansion differences between area 36 and layer 34, which enables to further open wells 40 to receive bumps 14.

Figure 10:
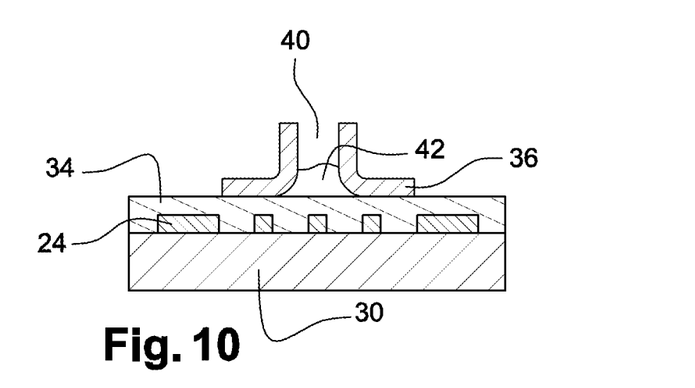
Figure 11:
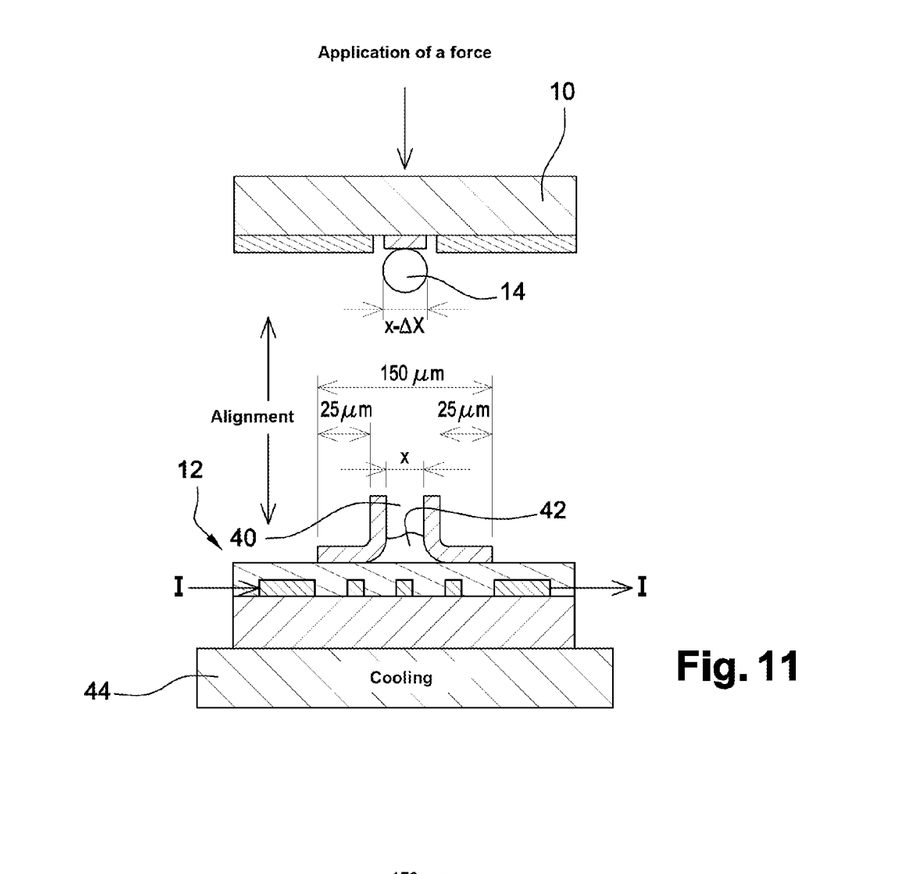

The method carries on with the deposition, for example, by silk-screening or inkjet, of a conductive ink 42 into each well 40, particularly a metal ink containing silver or copper (cross-section view of FIG. 10). Ink 42 especially enables to wet a metal bump 14 introduced into well 40 during the hybridization and forms an electric connection with this bump. The presence of ink 42 thus enables to use bumps 14 which do not or only very slightly wet the metal of area 36, such as for example gold bumps 14.

The method then carries on with the actual hybridization of microelectronic components 10 and 12.

Figure 12:
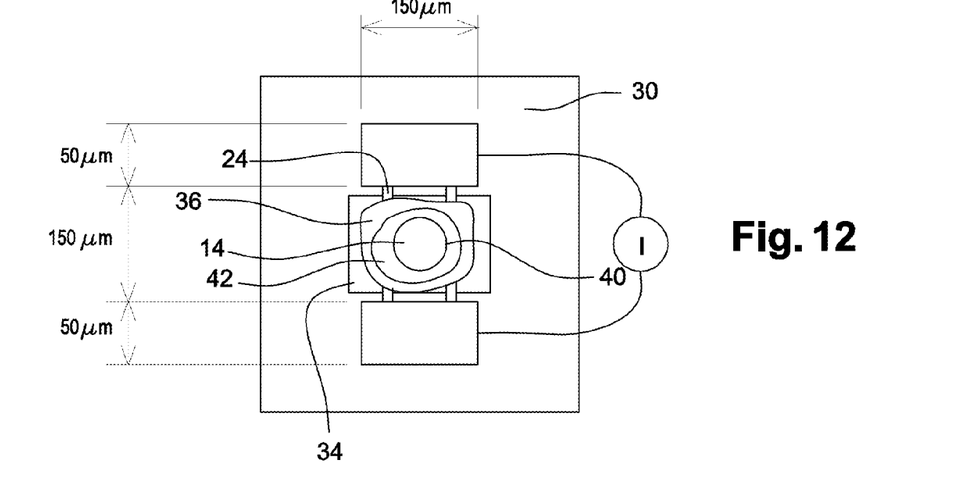

More particularly, first component 10 is transferred onto second component 12 by alignment thereof, and then by application of a force to first component 10 (FIG. 11), to introduce bumps 14 into wells 40, and thus place bumps 14 into contact with ink 42 (FIG. 12).

The surface of second component 12, opposite to that provided with connection elements 22 formed of wells 40 and of ink 42, is further placed into contact with a cooling system, for example, a refrigerated plate 44.

Finally, an electric current I is applied to each of resistive elements 24, which then heat up by Joule effect. The generated heat is transferred by convection to bumps 14 which melt, ink 42 being further submitted to an anneal which will further increase the conductivity thereof by the total evaporation of the solvents present in this metal ink. Area 36 does not melt under the effect of the heating since its melting temperature is selected to be higher than the temperature obtained by the heating. Particularly, the material forming area 36 has a melting temperature greater than that of bumps 14. Once the bumps have melted, the injection of current I is stopped, and bumps 14 cool down and solidify. Wells 40 especially enable to reinforce the mechanical resistance of hybridized components 10, 12.

According to an alternative embodiment, bumps 14 and the metal of area 36 are selected so that the bumps wet metal 36. For example, bumps 14 are made of a so-called "solder" metal, such as for example indium, tin, and gold and silver alloys. Ink 42 is then omitted.

Figure 13:
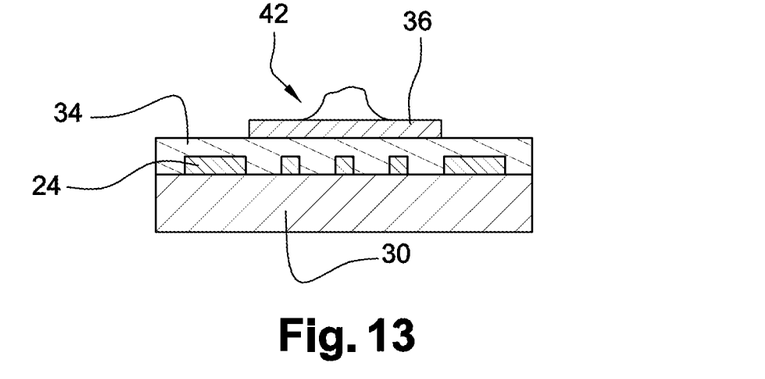
FIGS. 13 and 14 are simplified views illustrating a manufacturing method according to a second embodiment of the invention.

A manufacturing method according to a second embodiment of the invention will now be described in relation with FIGS. 13 and 14.

This method for example starts identically to the steps of the first embodiment described in relation with FIGS. 2 to 8. Unlike the first embodiment, the method carries on with the direct deposition of ink 42 on metal areas 36 with no forming of well 40 (cross-section view of FIG. 13). In the same way as for the first embodiment, the ink enables to use metal bumps 40 which do not or very slightly wet metal area 36, while providing an electric connection between bumps 40 and areas 36.

Figure 14:
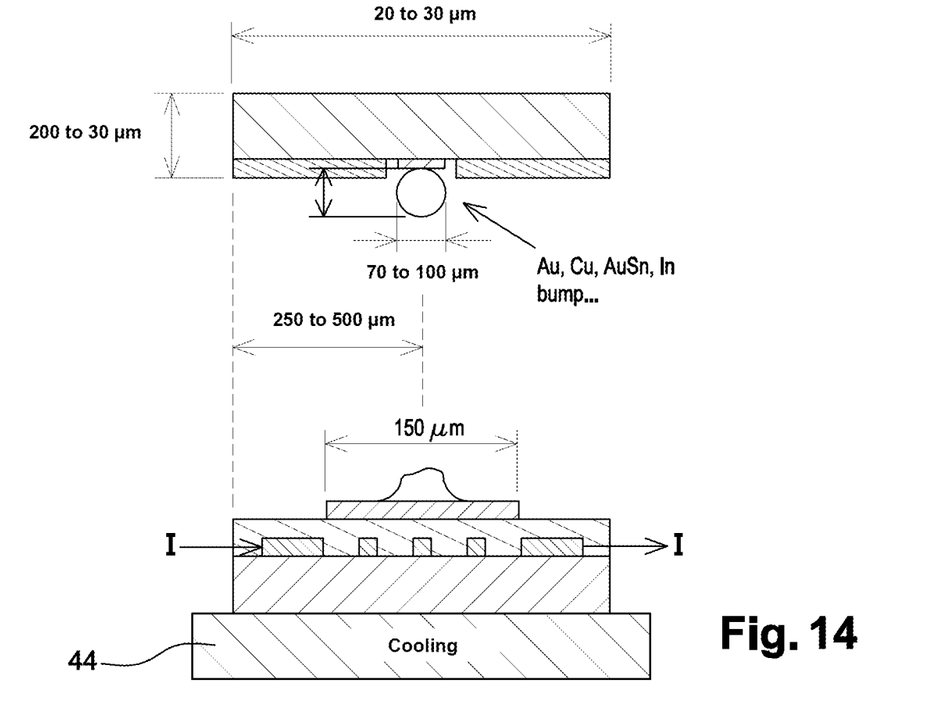

First component 10 is then transferred onto second component 12 by alignment of bumps 14 with areas 36 (FIG. 14). The surface of second component 12, opposite to that provided with connection elements 22 formed of areas 36 and of ink 42, is then cooled as previously described, and an electric current I is applied to each of resistive elements 24 which heat up by Joule effect. The generated heat is then transferred by convection to bumps 14 which melt, ink 42 further undergoing an anneal.

According to an alternative embodiment, bumps 14 and the metal of area 36 are selected so that the bumps wet metal 36. For example, bumps 14 are made of a so-called "solder" metal, such as for example indium and gold and tin alloys. Ink 42 is then omitted.

The hybridized devices thus obtained can be simply dehybridized. It is indeed sufficient to have a current circulate again through resistive elements 24, which have not been destroyed during the hybridization, to induce the melting of bumps 14 again, which enables to separate components 10, 12.

Figure 15:
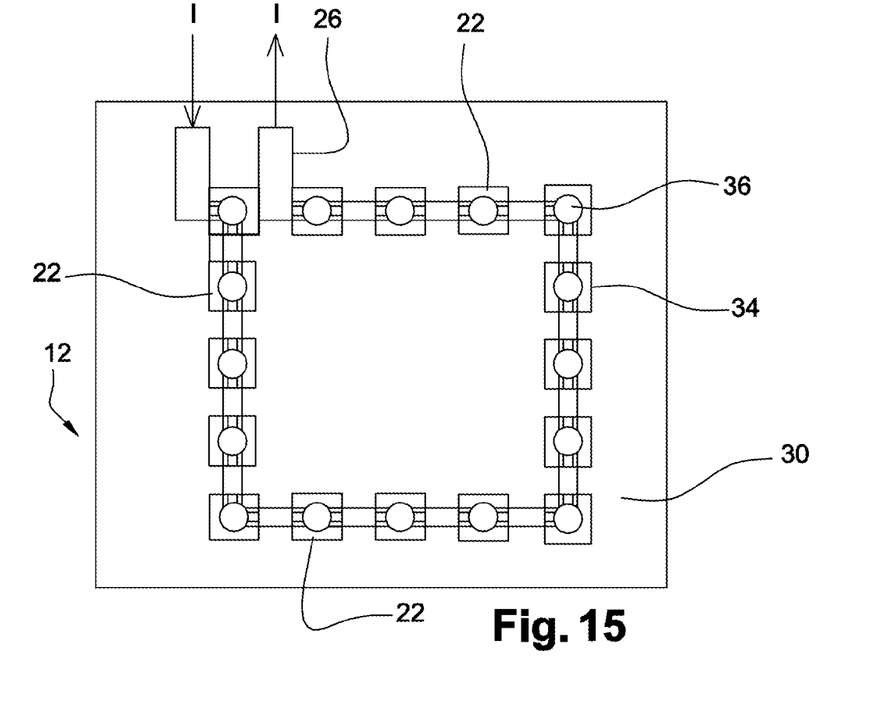
FIG. 15 is a simplified top view of a microelectronic component provided with resistive elements according to the invention.

FIG. 15, which is a top view of an embodiment of the second component 30, illustrates a connection diagram of resistive elements 24. Advantageously, resistive elements 24 are series-connected, so that they conduct a same current, for example in the range from 1 mA to 300 mA, and heat up substantially identically as soon as they are themselves identical. For example, elements 24 are formed from a single conductive metal strip having its ends forming terminals 26 for the application of current I. The current is for example injected by a current source via a current mirror.

FIG. 15 further illustrates an arrangement of a connection element 22 corresponding to a peripheral sealing of first circuit 10 on second circuit 12. Of course, the hybridization pattern depends on the targeted application.

Figure 16:
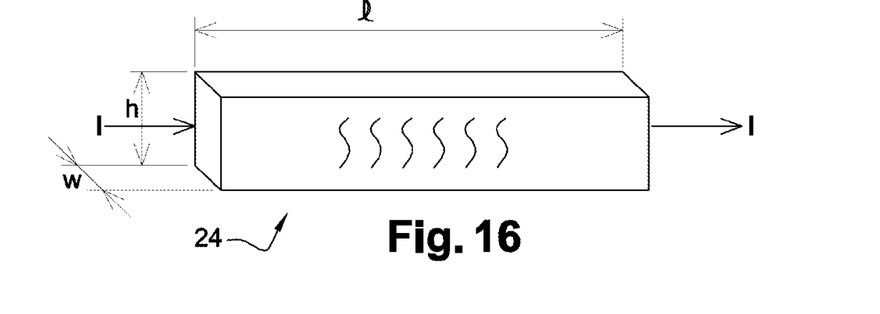
FIG. 16 is a perspective view of a resistive element.

FIG. 16 is a perspective view of an element 24 in the form of a rectilinear element, it being understood that the following remains valid for non-rectilinear elements, length l to be considered being the curvilinear length of the element.

It can be shown that heating $\Delta T$ per second of an element 24 conducting a current of intensity I can be modeled at the first degree according to relation:

$$\Delta T = \frac{\rho \times l^2}{2 \times k_p \times w^2 \times h^2} \times I^2$$

where:
$\rho$ is the resistivity per meter of the material forming element 24, in $\Omega/m$;
l is the length in meter of element 24;
w is the width in meter of element 24;

h is the height in meter of element 24;

k$_p$ is the heat conductivity of the material forming element 24, in W/K·m; and I is the intensity in ampere of the current flowing through element 24.

Several parameters are thus available, that is, the dimensions of element 24, the nature of the material(s) forming it, as well as the value of the current that it conducts, to control the heating that it generates. Particularly, it is possible to select elements 24 which allow a very intense and/or very fast heating of metal bumps 14.

Hybridization devices and a hybridization method where a melting of the metal bumps is obtained have been described.

The invention also applies to hybridizations where the bumps are not melted. In particular, so-called "cold" insertions where protruding connection elements, for example, hollow cylinders, are force-fit into bumps made of a ductile material, are known. Such a hybridization is for example described in document US-A-2011/0035925. The invention may also advantageously be used to locally heat the bumps in order to soften them without melting them, and thus ease the insertion of the connection element into the bump.

The invention claimed is:

1. A method of forming a hybridized device comprising:
   forming a first microelectronic component provided on a surface with metal bumps, and a second microelectronic component provided on a surface with connection elements corresponding to said metal bumps;
   placing the bumps of the first microelectronic component into contact with the connection elements of the second micro-electronic component; and
   attaching the bumps to the connection elements;
wherein the manufacturing of the second microelectronic component comprises:
   forming a substrate;
   forming, on a surface of the substrate, resistive elements at the locations provided for the connection elements;
   depositing an electric insulator layer at least on the resistive elements, the electric insulator layer being made of an electrically insulating material; and
   forming the connection elements, each comprising a metal well having an opening capable of receiving the corresponding metal bump of the first microelectronic component and at least partially filled with a fusible element, particularly indium or an alloy of tin and gold, or with a conductive ink, particularly based on silver or copper;
wherein the attachment of the balls to the connection elements comprises applying an electric current through the resistive elements to heat the bumps;
and wherein the manufacturing of the metal wells comprises:
   forming metal areas on the electric insulator layer at the locations provided for the connection elements, the metal areas being made of a metallic material having a greater thermal expansion coefficient than a thermal expansion coefficient of the electrically insulating material of the electric insulator layer; and
   cutting with a laser an opening in each of said metal areas.

2. The method of forming a hybridized device of claim 1, wherein the electric insulator is a fluorinated polymer.

3. The method of forming a hybridized device of claim 1, wherein the resistive elements are made in the form of coils or of rods.

4. The method of forming a hybridized device of claim 1, wherein the resistive elements are series-connected.

5. The method of forming a hybridized device of claim 1, wherein on application of the current, the surface of the second microelectronic component, opposite to the surface provided with the connection elements, is cooled down.

6. The method of forming a hybridized device of claim 1, wherein the substrate of the second microelectronic component comprises plastic, particularly PEN or PET.

7. A hybridized device comprising:
   a first microelectronic component provided on a surface with metal bumps; and
   a second microelectronic component provided on a surface with connection elements corresponding to said metal bumps, the metal bumps and the connection elements being mechanically attached,
wherein the second microelectronic component comprises:
   a substrate;
   resistive elements at the longitudinal station of the connection elements;
   an electric insulator layer interposed between the resistive elements and the connection elements the electric insulator layer being made of an electrically insulating material; and
   electric terminals for the application of an electric current in the resistive elements,
wherein the connection elements each comprise a metal well receiving the corresponding metal bump of the first microelectronic component, at least partially filled with a fusible element, particularly indium or an alloy of tin and gold, or of a conductive ink, particularly based on silver or copper;
   wherein each of the wells comprises at least one upward bead formed in a metal area formed on the electric insulator layer, the metal areas being made of a metallic material having a greater thermal expansion coefficient than a thermal expansion coefficient of the electrically insulating material of the electric insulator layer, and said bead being formed by cutting with a laser an opening in the metal area.

8. The device of claim 7, wherein the electric insulator is a fluorinated polymer.

9. The device of claim 7, wherein the resistive elements are made in the form of coils or of rods.

10. The device of claim 7, wherein the resistive elements are series-connected.

11. The device of claim 7, wherein the substrate of the second microelectronic component comprises plastic, particularly PEN or PET.

12. A device intended to be hybridized with another device provided with metal bumps, comprising:
   a substrate;
   connection elements, arranged on a surface of the substrate and capable of being rigidly attached to said metal bumps, said elements each comprising a metal well having an opening capable of receiving the corresponding metal bump of the first microelectronic component and at least partially filled with a fusible element, particularly indium or an alloy of tin and gold, or with a conductive ink, particularly based on silver or copper;
   resistive elements at the longitudinal station of the connection elements;
   an electric insulator layer interposed between the resistive elements and the connection elements the electric insulator layer being made of an electrically insulating material; and
   electric terminals for the application of an electric current in the resistive elements;
   wherein each of the wells comprises at least one upward bead formed in a metal area formed on the electric insulator layer, the metal areas being made of a metallic material having a greater thermal expansion coefficient than a thermal expansion coefficient of the electrically insulating material of the electric insulator layer, and said bead being formed by cutting with a laser an opening in the metal area.

\* \* \* \* \*